(12) United States Patent
Srinivasan et al.

(10) Patent No.: US 9,305,998 B2
(45) Date of Patent: Apr. 5, 2016

(54) ADHESION OF FERROELECTRIC MATERIAL TO UNDERLYING CONDUCTIVE CAPACITOR PLATE

(71) Applicant: Texas Instruments Incorporated, Dallas, TX (US)

(72) Inventors: Bhaskar Srinivasan, Plano, TX (US); Eric H. Warninghoff, Allen, TX (US); Alan Merriam, Plano, TX (US); Haowen Bu, Plano, TX (US); Brian E. Goodlin, Plano, TX (US); Manoj K. Jain, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 121 days.

(21) Appl. No.: 14/175,838

(22) Filed: Feb. 7, 2014

(65) Prior Publication Data

US 2014/0227805 A1 Aug. 14, 2014

Related U.S. Application Data

(60) Provisional application No. 61/762,992, filed on Feb. 11, 2013.

(51) Int. Cl.
*H01L 21/00* (2006.01)
*H01L 49/02* (2006.01)
*H01L 21/02* (2006.01)
*C23C 16/02* (2006.01)
*C23C 16/40* (2006.01)
*H01L 27/115* (2006.01)

(52) U.S. Cl.
CPC ............ *H01L 28/75* (2013.01); *C23C 16/0281* (2013.01); *C23C 16/409* (2013.01); *H01L 21/02197* (2013.01); *H01L 21/02271* (2013.01); *H01L 21/02304* (2013.01); *H01L 28/55* (2013.01); *H01L 27/11502* (2013.01)

(58) Field of Classification Search
CPC .............. H01L 28/75; H01L 21/02197; H01L 21/02271; H01L 21/02304; C23C 16/409; C23C 16/0281
See application file for complete search history.

(56) References Cited

U.S. PATENT DOCUMENTS

| | | | |
|---|---|---|---|
| 6,316,797 B1 | 11/2001 | Van Buskirk et al. | |
| 6,388,281 B1 * | 5/2002 | Jung et al. | 257/295 |

(Continued)

OTHER PUBLICATIONS

U.S. Appl. No. 14/169,120, filed Jan. 30, 2014, entitled "Multi-Step Deposition of Ferroelectric Dielectric Material".

*Primary Examiner* — Minh-Loan Tran
*Assistant Examiner* — Farid Khan
(74) *Attorney, Agent, or Firm* — Rose A. Keagy; Frank D. Cimino

(57) ABSTRACT

Deposition of lead-zirconium-titanate (PZT) ferroelectric material over iridium metal, in the formation of a ferroelectric capacitor in an integrated circuit. The capacitor is formed by the deposition of a lower conductive plate layer having iridium metal as a top layer. The surface of the iridium metal is thermally oxidized, prior to or during the deposition of the PZT material. The resulting iridium oxide at the surface of the iridium metal is very thin, on the order of a few nanometers, which allows the deposited PZT to nucleate according to the crystalline structure of the iridium metal rather than that of iridium oxide. The iridium oxide is also of intermediate stoichiometry ($IrO_{2-x}$), and reacts with the PZT material being deposited.

13 Claims, 3 Drawing Sheets

(56) References Cited

U.S. PATENT DOCUMENTS

| | | | |
|---|---|---|---|
| 6,420,740 B1 * | 7/2002 | Zhang et al. | 257/295 |
| 6,656,748 B2 | 12/2003 | Hall et al. | |
| 6,730,354 B2 | 5/2004 | Gilbert et al. | |
| 6,984,417 B2 | 1/2006 | Van Buskirk et al. | |
| 7,312,091 B2 | 12/2007 | Lee et al. | |
| 7,862,857 B2 | 1/2011 | Van Buskirk et al. | |
| 8,088,678 B2 * | 1/2012 | Kitano et al. | 438/586 |
| 2003/0119273 A1 * | 6/2003 | Aggarwal et al. | 438/396 |
| 2005/0064605 A1 * | 3/2005 | Lee et al. | 438/3 |
| 2005/0199935 A1 * | 9/2005 | Zhang et al. | 257/310 |
| 2006/0134808 A1 * | 6/2006 | Summerfelt et al. | 438/3 |
| 2008/0020489 A1 * | 1/2008 | Im et al. | 438/3 |
| 2008/0081380 A1 * | 4/2008 | Celii et al. | 438/3 |
| 2008/0311683 A1 * | 12/2008 | Wang | 438/3 |
| 2010/0001325 A1 * | 1/2010 | Sashida | 257/295 |
| 2010/0078762 A1 * | 4/2010 | Wang | 257/532 |
| 2013/0056811 A1 | 3/2013 | Lin et al. | |

* cited by examiner

ADHESION OF FERROELECTRIC MATERIAL TO UNDERLYING CONDUCTIVE CAPACITOR PLATE

CROSS-REFERENCE TO RELATED APPLICATIONS

This application claims priority, under 35 U.S.C. §119(e), of Provisional Application No. 61/762,992, filed Feb. 11, 2013, incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuit manufacture. Embodiments of this invention are more specifically directed to the formation of capacitors in memory devices such as ferroelectric memories.

Conventional metal-oxide-semiconductor (MOS) and complementary MOS (CMOS) logic and memory devices are prevalent in modern electronic devices and systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have been developed in recent years.

A recently developed technology for realizing non-volatile solid-state memory devices involves the construction of capacitors in which the dielectric material is a polarizable ferroelectric material, such as lead-zirconium-titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits.

Non-volatile solid-state read/write random access memory (RAM) devices based on ferroelectric capacitors, such memory devices commonly referred to as "ferroelectric RAM", or "FeRAM", or "FRAM" devices, have been implemented in many electronic systems, particularly portable electronic devices and systems. FRAMs are especially attractive in implantable medical devices, such as pacemakers and defibrillators. Various memory cell architectures including ferroelectric capacitors are known in the art, including the well-known 2T2C (two transistor, two capacitor) cells. Another type of FRAM cell is based on the well-known "6T" CMOS static RAM cell, which operates as an SRAM cell during normal operation, but in which ferroelectric capacitors coupled to each storage node can be programmed with the stored data state to preserve memory contents in non-volatile fashion. Ferroelectric capacitors are also implemented in some integrated circuits as programmable analog capacitors.

FIG. 1 illustrates the construction of an example of a portion of an integrated circuit including a portion of a ferroelectric random access memory (FRAM). In this example, ferroelectric capacitor 15 and metal-oxide-semiconductor (MOS) transistor 17 are disposed at or near a semiconducting surface of a semiconductor substrate, although capacitor 15 and transistor 17 may instead be formed at the surface of a semiconductor layer that overlies an insulator layer, such as according to a silicon-on-insulator (SOI) technology as known in the art. In the example of FIG. 1, isolation dielectric structures 11, gate electrode 16, and n-type source/drain regions 14 are disposed at or near the surface of substrate 10, in the conventional manner for MOS integrated circuits. N-channel MOS transistor 17 in the example of FIG. 1 includes n-type source/drain regions 14 at the surface of p-type substrate 10 (or of a p-type "well" formed into substrate 10, as the case may be), with gate electrode 16 overlying a channel region between source/drain regions 14, and separated from the channel region by a gate dielectric, as conventional. Interlevel dielectric 12 is disposed over transistor 17, with conductive plug 13 disposed in a contact opening through interlevel dielectric 12 to provide a conductive connection between one of source/drain regions 14 of transistor 17 and lower plate 20a of ferroelectric capacitor 15.

In the example of FIG. 1, ferroelectric capacitor 15 is formed of a ferroelectric "sandwich" stack of conductive plates 20a, 20b, between which ferroelectric material 22 is disposed. Lower plate 20a is formed at a location overlying conductive plug 13, as shown in FIG. 2, so as to be in electrical contact with the underlying source/drain region 14 by way of conductive plug 13. Conductive plates 20a, 20b are typically formed of the same conductive material or materials as one another, for purposes of symmetry, simplicity of the manufacturing flow, and improved ferroelectric polarization performance. As mentioned above, ferroelectric material 22 in this conventional transistor 15 is typically lead-zirconium-titanate (PZT) or strontium-bismuth-tantalate (SBT), deposited by way of metalorganic chemical vapor deposition. Ferroelectric material 22 in capacitor 15 is desirably as thin as practicable, for purposes of electrical performance (e.g., capacitance), and for consistency with the deep submicron features used to realize modern integrated circuits.

Lower conductive plate 20a and upper conductive plate 20b are formed from one or more layers of conductive metals, metal oxides, and the like. A typical construction of lower conductive plate 20a is a stack of a diffusion barrier layer in contact with conductive plug 13 and a layer of a noble metal (e.g., Ru, Pt, Ir, Rh, Pt, Pd, Au) or metal oxide (e.g., RuOx, IrOx, PdOx, $SrRuO_3$) overlying the barrier layer and in contact with the ferroelectric material 22. As described in commonly assigned U.S. Pat. No. 6,656,748, incorporated herein by reference, in capacitors in which PZT serves as ferroelectric material 22, sputter deposited iridium (Ir) is a preferred material for the portion of lower conductive plate 20a that is in direct contact with the PZT. As mentioned above, upper conductive plate 20b is typically formed of the same materials as lower conductive plate 20a, deposited in the reverse order (e.g., with iridium in contact with the top surface of PZT ferroelectric material 22).

As well-known in the manufacture of integrated circuits, the adhesion between adjacent layers in the integrated circuit is an important factor in the manufacturing yield and also in the reliability of the integrated circuits. Ensuring good adhesion between materials can be a particular challenge in complex structures such as ferroelectric capacitor 15 of FIG. 1, because of the dissimilarity of materials involved in the structure. It has been observed that delamination of PZT ferroelectric material 22 from the top surface of lower conductive plate 20a can be a particular problem in the manufacture of FRAMs.

By way of further background, U.S. Pat. No. 6,730,354, incorporated herein by reference, describes the formation of a PZT film by way of metalorganic chemical vapor deposition (MOCVD).

BRIEF SUMMARY OF THE INVENTION

Disclosed embodiments provide a method of depositing conductive material in contact with overlying lead-zirconium-titanate (PZT) ferroelectric material in the manufacture of an integrated circuit structure, and a structure so manufactured, with improved adhesion and thus reduced susceptibility to delamination between the conductive material and the overlying PZT ferroelectric material.

Disclosed embodiments provide such a method and structure that uses iridium metal as the uppermost conductive plate material, enabling the PZT material to nucleate in a favorable crystalline orientation.

Disclosed embodiments provide such a method and structure that is compatible with process conditions encountered later in the manufacturing flow.

Disclosed embodiments provide such a method and structure that provides thin, high quality, ferroelectric films suitable for use in modern deep submicron integrated circuits.

Other objects and advantages of the disclosed embodiments will be apparent to those of ordinary skill in the art having reference to the following specification together with its drawings.

Some of the disclosed embodiments are implemented by deposition of a lower conductive plate layer of the capacitor, including iridium metal at a surface portion of the layer. The iridium metal is oxidized, prior to or during the deposition of lead-zirconium-titanate (PZT) ferroelectric material.

DETAILED DESCRIPTION OF THE INVENTION

Figure 1:
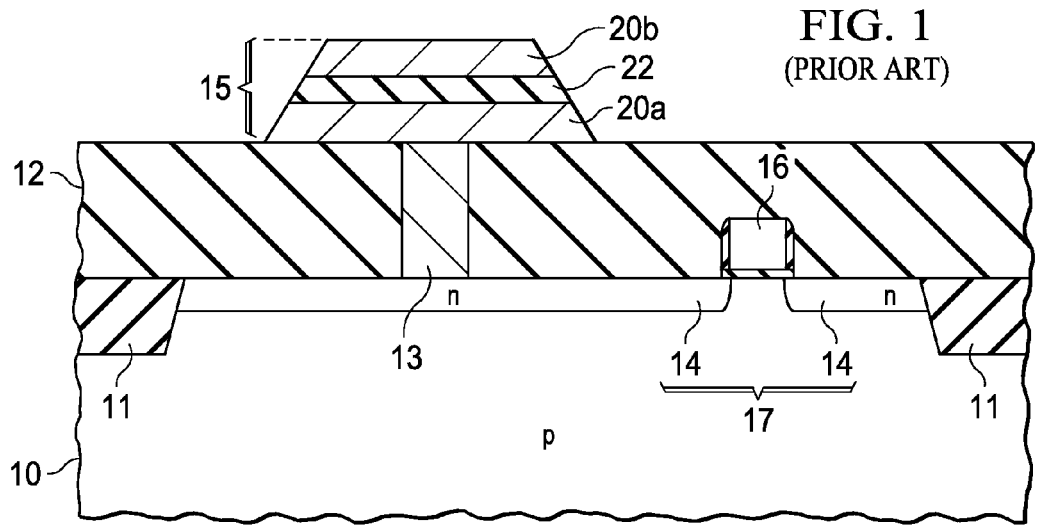
FIG. 1 is a cross-sectional view of a portion of an integrated circuit including a ferroelectric capacitor at a selected stage of manufacture according to embodiments of this invention.

The one or more embodiments disclosed in this specification are described as implemented into the manufacture of semiconductor integrated circuits that include ferroelectric films, because it is contemplated that such implementation is particularly advantageous in that context. However, it is also contemplated that those skilled in the art having reference to this specification will recognize that concepts of this invention may be beneficially applied to other applications. Accordingly, it is to be understood that the following description is provided by way of example only, and is not intended to limit the true scope of this invention as claimed.

As discussed above, one issue that is commonly encountered in the manufacture of integrated circuits with ferroelectric capacitors is the vulnerability of the various deposited layers to delaminate from one another. It has been observed, in connection with this invention, that the interface between iridium metal and an overlying layer of lead-zirconium-titanate (PZT) ferroelectric material, in the construction of a ferroelectric capacitor, is particularly vulnerable to delamination. If sufficiently severe, delamination of the PZT material from the underlying iridium can occur at later stages of the process, including in the deposition of the PZT layer itself, and also during the stack etch of the capacitor in which the lower and upper conductive plates and the PZT ferroelectric material between the two are etched in a single etch operation. Delamination during stack etch is especially troublesome, not only because of the yield loss, but also due to the significant particulate contamination in the plasma etch chamber caused by rampant delamination, necessitating shutdown and cleaning of the chamber.

It has also been observed, in connection with this invention, that the susceptibility of the PZT ferroelectric material to delamination depends on certain process conditions. For example, it has been observed that delamination of the PZT occurs more readily in larger wafer sizes (e.g., 300 mm diameter wafers as compared with 200 mm wafers). In general, it is believed that delamination results from stresses in the iridium and PZT layers. The increase in wafer diameter from 200 mm to 300 mm increases the tensile stress in the deposited PZT film because of the much larger surface area of the 300 mm wafer. In addition, iridium metal is typically deposited at a lower temperature (e.g., at about 450 deg C.) in the 300 mm process flow than in the 200 mm flow (e.g., at about 500 deg C.), due to limitations in the deposition equipment, specifically to avoid overheating by the larger mass of the 300 mm chuck. As a result, stress in the deposited iridium will change more as the wafer is heated to the PZT deposition process temperature of about 650 deg C., when deposited at the lower temperature of the 300 mm process flow, than it would if deposited at a higher temperature in the 200 mm flow. The combination of the larger tensile stress in the PZT with the larger change in stress in the immediately underlying iridium metal is believed, according to this invention, to result in the much greater susceptibility of the PZT to delamination in the larger, 300 mm, wafers.

Figure 2:
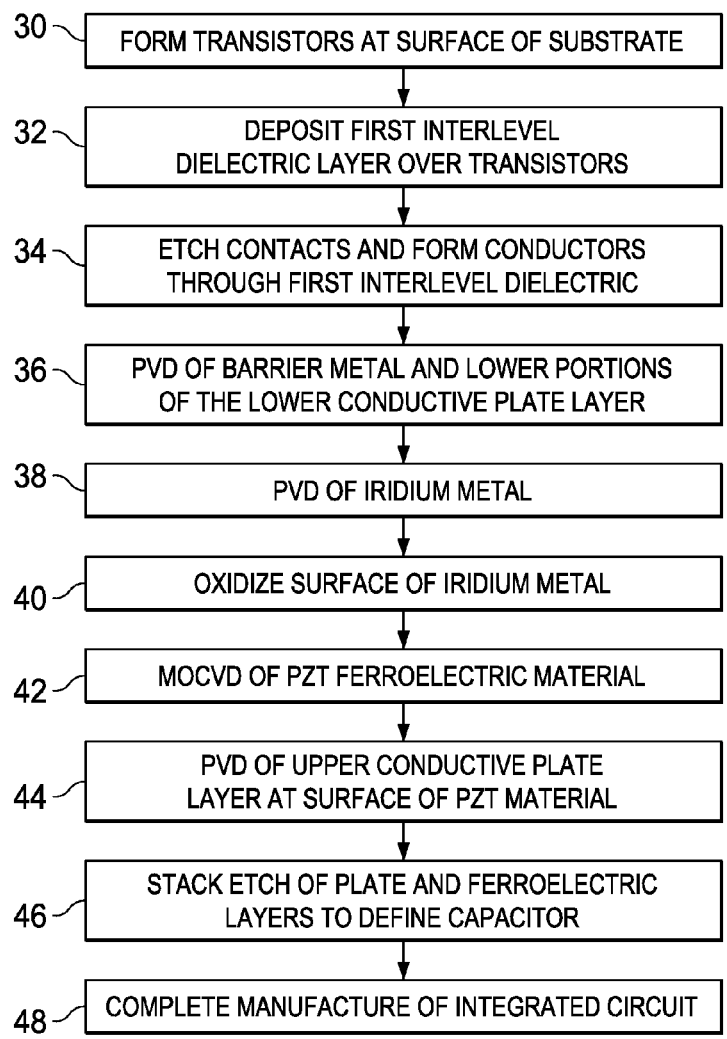
FIG. 2 is a flow diagram illustrating a process of forming a ferroelectric capacitor according to disclosed embodiments.

Referring now to FIG. 2, a process of fabricating an integrated circuit including one or more ferroelectric capacitors 15 such as shown in FIG. 1 will now be described in a general sense. In process 30 of FIG. 2, transistors such as transistor 17 are formed, in the conventional manner, at or near the semiconducting surface of substrate 10 or other support body. As part of this process 30, isolation dielectric structures 11, the appropriate doped wells (not shown), a gate dielectric layer, gate electrodes 16, and source/drain regions 14, among other structures, are formed at or near the surface of substrate 10 according to conventional MOS processes. N-channel MOS transistor 17 shown in FIG. 1 may be formed in the conventional manner by deposition and photolithographic patterning and etch of polysilicon material to define gate electrode 16 overlying a gate dielectric, with n-type source/drain regions 14 formed on either side of gate electrode 16 by ion implantation and subsequent activation anneal, in the well-known self-aligned manner.

In process 32, first interlevel dielectric 12 is then deposited over the transistors formed in process 30, for example by way of chemical vapor deposition, followed by planarization if desired. In process 34, contact openings (i.e., vias) are etched through first interlevel dielectric 12 at selected locations, and conductive plugs 13 are formed into those openings in the conventional manner to provide an electrical contact between one of source/drain regions 14 of MOS transistor 17 and the eventual ferroelectric capacitor 15. Conductive plug 13 may be formed of a metal such as tungsten, titanium, and the like, or an alloy thereof, Following the formation of first interlevel dielectric layer 12 in process 32, and the contact etch and conductor formation in process 34, ferroelectric capacitor 15 is then formed, beginning with process 36. In a general sense, process 36 forms one or more conductive layers over first interlevel dielectric layer 12 and conductive plugs 13, to serve as the lower conductive plate layer for capacitor 15. Typically, process 36 will be performed by the physical vapor deposition (PVD) of one or more layers of conductive material in succession; as will be described below, sputter deposition is the typical PVD technology used in disclosed embodiments, although other suitable PVD techniques may alternatively be used for the deposition of one or more of these conductive layers. According to disclosed embodiments, an oxidation barrier layer is first formed by sputter deposition over the surface of first interlevel dielectric layer 12. Examples of the oxidation barrier layer deposited in process 36 include titanium nitride, and other materials that will serve to inhibit the oxidation of the overlying conductor material (e.g., a Ti/TiN stack) by oxygen in first interlevel dielectric layer 12. This oxidation barrier is followed by the sputter deposition, also in process 36, of a conductive diffusion barrier layer, for example, TiAlN; other materials, such as TiAlON, TaSiN, CrN, HfN, TaN, HfAlN, CrAlN, TiSiN, CrSiN, and the like may alternatively be serve as diffusion barrier materials. This diffusion barrier layer serves to prevent diffusion of constituents of the eventual lower conductive layer 20a into the active regions of transistors 17, as known in the art. Additional layers of conductive material may additionally be deposited, as desired, in this process 36.

According to disclosed embodiments, after the deposition of the barrier layers and other conductive layers in process 36, process 38 is then performed to deposit a layer of iridium (Ir) metal as a top portion of lower conductive plate layer 20a. Process 38 is typically carried out by way of PVD, generally by way of sputter deposition as known in the art. The layer of iridium metal deposited in process 38 may form the major portion of the thickness of lower conductive plate layer 20a, or alternatively may occupy only a small fraction of the overall thickness of lower conductive plate layer 20a. In either case, according to disclosed embodiments, iridium metal is at the top surface of lower conductive plate layer 20a as deposited.

Figure 3A:
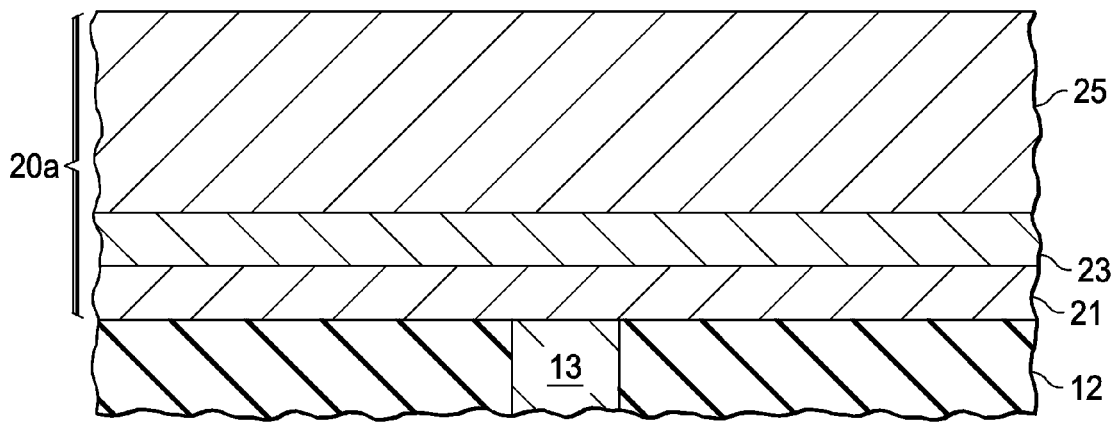
FIGS. 3a through 3c are cross-sectional views of a portion of an integrated circuit including a ferroelectric capacitor, in which the lower conductive plate layer is deposited according to respective ones of the disclosed embodiments.

FIG. 3a illustrates, in cross-section, an example of the construction of an integrated circuit in which ferroelectric capacitor 15 is to be constructed, at a point in its manufacture following PVD process 38. FIG. 3a illustrates a location of the wafer roughly corresponding to the view of FIG. 1, at which conductive plug 13 has been formed through a contact opening in first interlevel dielectric 12. As shown in FIG. 3a, lower conductive plate layer 20a extends over the entire surface of first interlevel dielectric 12 and conductive plugs 13, as this point in the process is well prior to the etch that defines the particular locations of ferroelectric capacitors 15. At the point in the process shown in FIG. 3a, lower conductive plate layer 20a includes oxidation barrier layer 21 as its bottom-most layer, in direct contact with first interlevel dielectric 12 and conductive plugs 13. In this example of an embodiment, the material of oxidation barrier layer 21 is TiN, deposited to a thickness of about 50 nm. Diffusion barrier layer 23 is the next layer within lower conductive plate layer 20a, in the example of FIG. 3a, and as such overlies oxidation barrier layer 21. In this example, the material of diffusion barrier layer 23 is TiAlN at a thickness of about 30 to 70 nm. According to this example of the embodiment of FIG. 3a, iridium metal layer 25 directly overlies diffusion barrier layer 23, and extends to the top surface of lower conductive plate layer 20a. In this example, the thickness of iridium metal layer 25 as deposited is about 70 nm. FIG. 3a illustrates the state of the integrated circuits being formed following process 38 of FIG. 2.

Figure 3B:
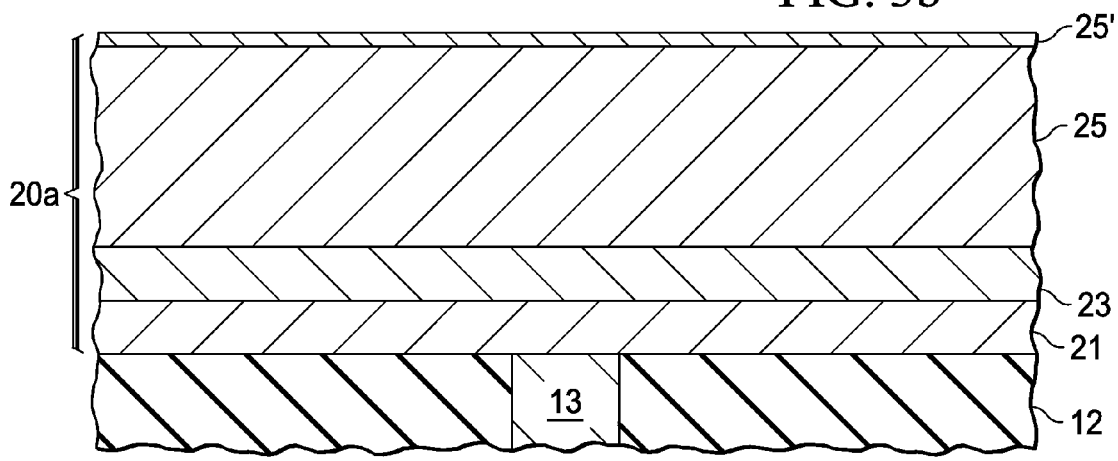

Referring back to the flow diagram of FIG. 2, following process 38, the surface of iridium metal layer 25 is oxidized in process 40. According to disclosed embodiments, oxidation process 40 is performed by way of thermal oxidation. It is contemplated that oxidation process 40 may be performed according to various techniques, as will be described below relative to specific embodiments. In any case, according to the disclosed embodiments, the result of oxidation process 40 will be a very thin layer of reactive iridium oxide ($IrO_{2-x}$) at the surface of iridium metal layer 25, and thus at the top surface of lower conductive plate layer 20a. FIG. 3b illustrates, in cross-section, an example of the integrated circuit structure following oxidation process 40. As shown in FIG. 3b, a very thin iridium oxide layer 25' is disposed at the exposed top surface of iridium metal layer 25, as a result of oxidation process 40. It is contemplated that the thickness of iridium oxide layer 25' will typically be on the order of a few monolayers of reactive iridium oxide ($IrO_{2-x}$) molecules, for example as few as one or two monolayers. As known in the art, each monolayer of reactive iridium oxide ($IrO_{2-x}$) is about two nanometers thick. It is contemplated that the iridium oxide formed in oxidation process 40 will be somewhat reactive, due to its non-stoichiometric (i.e., $IrO_{2-x}$ rather than $IrO_2$) composition.

Following iridium oxidation process 40, process 42 next deposits PZT ferroelectric material 22 overall, specifically over iridium oxide layer 25' formed in process 38. Process 42 is typically performed by conventional metalorganic chemical vapor deposition (MOCVD). An example of a multi-step approach suitable for PZT deposition process 42 is described in copending and commonly assigned U.S. application Ser. No. 14/169,120, filed 30 Jan. 2014, entitled "Multi-Step Deposition of Ferroelectric Dielectric Material", incorporated herein by reference.

Figure 3C:
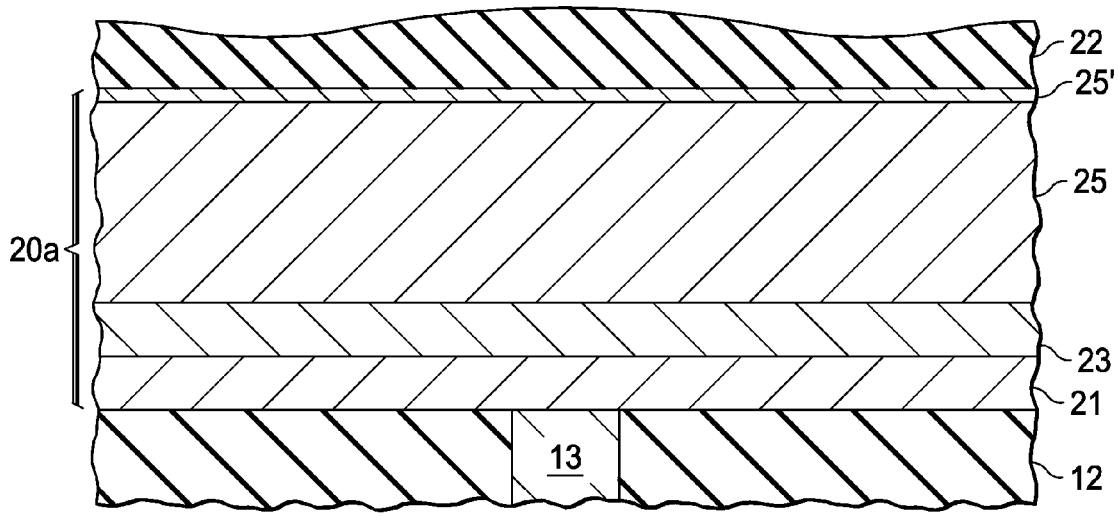

FIG. 3c illustrates, in cross-section, an example of an integrated circuit structure following PZT deposition process 42, illustrating that PZT ferroelectric material 22 is in contact with iridium oxide layer 25' formed in oxidation process 40. However, it is contemplated that because the iridium oxide formed in process 40 is somewhat reactive, due to its intermediate stoichiometry $IrO_{2-x}$ form, the deposited PZT molecules will tend to react with the reactive iridium oxide molecules at the surface of the film; this reaction is believed to improve the adhesion of PZT ferroelectric material 22 to lower conductive plate layer 20a, reducing the vulnerability of the structure to delamination as compared with conventional methods.

In addition, it is contemplated, in connection with the disclosed embodiments, that the minimal thickness of iridium oxide layer 25' formed in process 40 enables the nucleation of PZT ferroelectric material 22 to follow the <111> crystalline structure of iridium metal (Ir) layer 25, which is desirable. As known in the art, iridium oxide ($IrO_2$) has a different crystal orientation from iridium metal; conventional structures in which the lower conductive plate has relatively thick (e.g., 50 nm) layers of $IrO_2$ at the surface thus result in a different crystalline structure of the overlying PZT ferroelectric material as deposited. According to some of the disclosed embodiments, therefore, the very thin (less than a few monolayers, for example one or two monolayers) of reactive iridium oxide formed by process 40 provide a ferroelectric capacitor with improved electrical properties, both in conductivity of the lower conductive plate and also in the characteristics of the PZT ferroelectric material, as compared with capacitors having thicker, deposited, iridium oxide layers in contact with the PZT material.

Figure 4A:
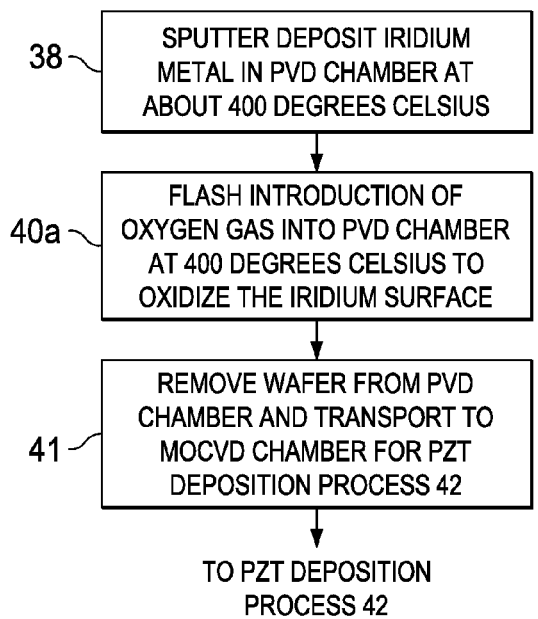
FIGS. 4a through 4c are flow diagrams illustrating a process of oxidizing iridium metal in the lower conductive plate layer according to respective ones of the disclosed embodiments.

FIG. 4a illustrates a particular embodiment of oxidation process 40, as will now be described in further detail. In this embodiment, iridium metal deposition process 38 is performed by sputter deposition in a conventional PVD chamber. According to this embodiment, the temperature at which deposition process 38 is performed is at about 400 deg C. Process 38 is performed until iridium metal layer 25 of the desired thickness is formed at the wafer, as shown in FIG. 3b. As conventional in the art, iridium deposition process 38 is typically performed in an inert atmosphere, with substantially no oxygen present within the PVD chamber.

In this embodiment of FIG. 4a, the surface of iridium metal layer 25 is oxidized in process 40a following the completion of sputter deposition process 38, in the same PVD chamber used in process 38 to sputter deposit iridium metal layer 25. In particular, oxidation process 40a is performed by introducing oxygen gas, for a brief time interval, into the PVD chamber at the same temperature (e.g., 400 deg C.) and other process conditions (e.g., chamber pressure of about 2 to 5 mTorr) as deposition process 38. In one example of this embodiment, process 40a is performed by introducing oxygen at a flow rate ranging from about 10 to about 60 sccm for a time ranging from about two seconds to about 10 seconds, under the same process conditions as sputter deposition process 38. It has been observed, in connection with this invention, that this "flash" oxidation process 40a is sufficient to form a thin layer 25' of reactive iridium oxide (i.e., of intermediate stoichiometry, $IrO_{2-x}$, due to the limited supply of oxygen gas in process 40a) at the surface of lower conductive plate layer 20a. Following this "flash" oxidation process 40a, the wafer is then removed from the PVD chamber and transported to an MOCVD chamber or other equipment in process 41, in preparation for PZT deposition process 42 as described above.

Figure 4B:
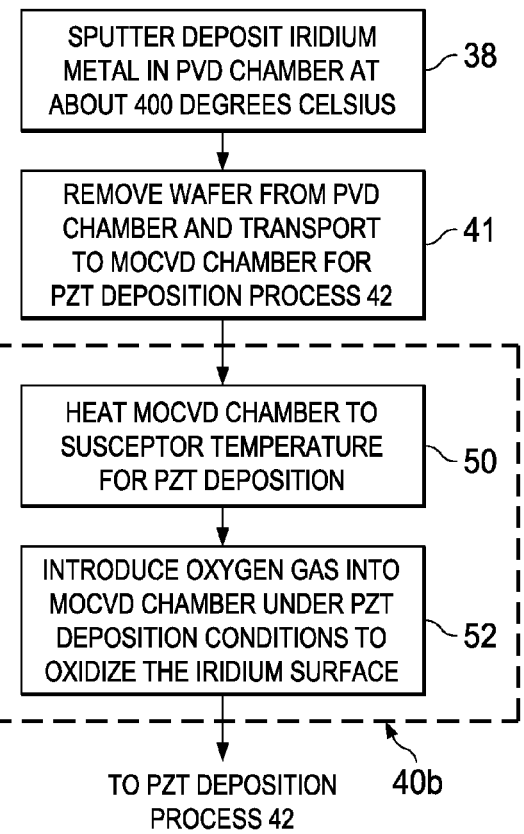

FIG. 4b illustrates another embodiment of oxidation process 40. In this embodiment, iridium metal layer 25 of the desired thickness is deposited in process 38 by way of sputter deposition in a conventional PVD chamber, as described above. The process conditions of process 38 may correspond to those conventionally used for sputter deposition of iridium (e.g., temperature of about 400 deg C., at a pressure of 2 to 5 mTorr). In this embodiment, process 41 is performed after sputter deposition process 38, by removing the wafer from the PVD chamber and transporting it to an MOCVD chamber or other equipment for the deposition of PZT ferroelectric material 22.

In this embodiment shown in FIG. 4b, oxidation process 40b is performed prior to PZT deposition process 42, but in the same MOCVD chamber in which PZT ferroelectric material 22 will be deposited in process 42. An example of an MOCVD system suitable for oxidation process 40b and MOCVD process 42 according to this embodiment is described in U.S. Pat. No. 6,730,354, incorporated herein by reference. Oxidation process 40b in this embodiment begins with the heating of the MOCVD chamber, in process 50, to the desired temperature for PZT deposition process 42. As described in the above-incorporated U.S. Pat. No. 6,730,354, heating process 50 may be performed in several stages, including a preheating stage in which the wafer is in the MOCVD chamber prior to its placement on the susceptor. Other operations involved in the preparation of the chamber for PZT deposition, such as purges and the like, may also be performed. An example of the process temperature for MOCVD attained in process 50 ranges from about 600 deg C. to about 650 deg C., as measured at the susceptor upon which the wafer is placed for deposition in that chamber. While the susceptor temperature is commonly used in the art to refer to the processing temperature, the actual temperature at the surface of the wafer will generally be less than this temperature of the susceptor, for example on the order of 20 deg C. As typical in the art, therefore, this specification will refer to the susceptor temperature as the processing temperature for processes 40b, 42. It is contemplated that those skilled in the art, having reference to this specification, will readily comprehend, from this description, the temperature at which these processes are carried out for their particular implementation. Also in process 50, other conditions in the MOCVD chamber (e.g., pressure ranging from 1 torr to 5 torr) suitable for the deposition of PZT are also established.

In process 52, oxygen gas is then introduced into the MOCVD chamber. The flow rate of this oxygen gas and the time interval in which oxygen gas is introduced (i.e., prior to introduction of the vaporized lead, zirconium, and titanium precursors for deposition of PZT) are selected in order to oxidize the surface of iridium metal layer 25 of lower conductive plate layer 20a under the conditions of the MOCVD chamber, such as the process temperature established in process 50. One example of process 52 according to this embodiment introduces oxygen gas at a flow rate ranging from about 2000 sccm to about 6000 sccm, for a time interval ranging from about 5 seconds to about 80 seconds, typically from about 30 to 60 seconds, at the temperature and other conditions established for PZT deposition in process 50. The introduction of oxygen gas at the elevated temperature in the MOCVD chamber in process 52 according to this embodiment causes the formation of reactive iridium oxide layer 25' at the surface of iridium metal layer 25, as shown in FIG. 3b. PZT process 42 can then immediately follow oxidation process 40b in this embodiment of the invention, including the introduction of the vaporized lead, zirconium, and titanium precursors, in combination with the desired composition and flow rate of oxidizing gas as known in the art, and as described in the above-incorporated application Ser. No. 14/169,120.

Figure 4C:
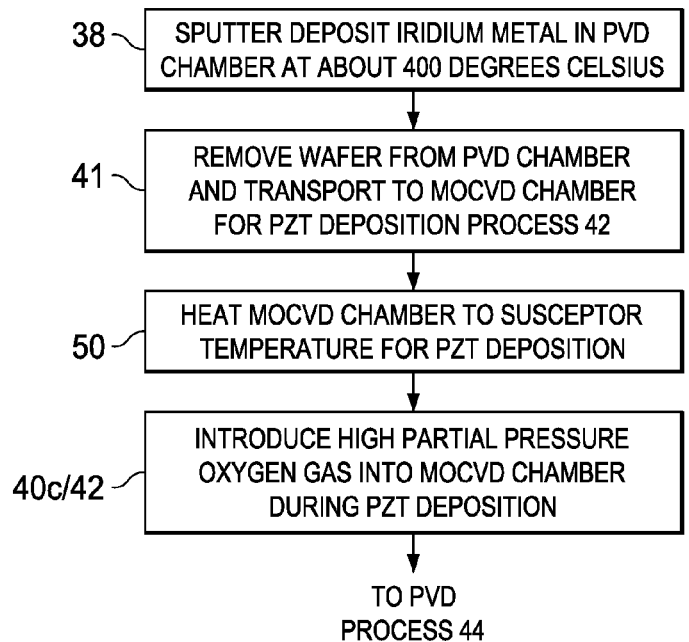

FIG. 4c illustrates a method according to another embodiment in which, in a general sense, oxidation process 40c oxidizes the surface of iridium metal layer 25 during the deposition of PZT ferroelectric layer 22 in process 42. As shown in FIG. 4c, iridium metal layer 25 of the desired thickness is deposited in sputter deposition process 38 in a conventional PVD chamber, as described above. Process 41 is then performed, removing the wafer from the PVD chamber and transporting it to an MOCVD chamber or other equipment for the deposition of PZT ferroelectric material 22. This stage of the process is performed with the wafer at a stage of manufacture such as that shown in FIG. 3a, with lower conductive plate layer 20a having iridium metal layer 25 at its surface. Once the wafer is placed in the MOCVD chamber, the chamber is then heated in the conventional manner, for example as described in the above-incorporated U.S. Pat. No. 6,730,354, to the desired temperature for PZT deposition process 42, for example a susceptor temperature ranging from about 600 deg C. to about 650 deg C. The MOCVD chamber is controlled to arrive at the other applicable conditions for PZT deposition, such conditions including, for example, a chamber pressure ranging from 1 to 5 torr (e.g., 2 torr).

Following heating process 50, combined oxidation and PZT deposition process 40c/42 is then performed. In this embodiment, oxygen gas is introduced at a higher partial pressure than that conventionally used in the MOCVD deposition of PZT ferroelectric material 22. One example of oxidizing gas introduced in the conventional deposition of PZT is the combination of $O_2$ at a flow rate of about 1500 sccm with argon at a flow rate of about 3000 sccm. In contrast, process 40c/42 according to one example of this embodiment introduces oxygen gas at a higher flow rate, such as ranging from about 2000 sccm to about 6000 sccm, which necessarily increases the partial pressure of oxygen at the surface of iridium metal layer 25, commencing with the start of the PZT deposition. It has been observed that this combined oxidation and PZT deposition process 40c/42 operates to oxidize the surface of iridium metal layer 25, forming reactive iridium oxide layer 25', which reacts with the PZT molecules also deposited in process 40c/42. This reaction between the PZT is believed to improve the adhesion of PZT ferroelectric material 22 to lower conductive plate layer 20a. More specifically, it is believed that carbonaceous species in the organometallic PZT precursors are oxidized during deposition process 40c/42 at this higher oxygen flow rate, which promotes better adhesion of the deposited PZT ferroelectric material 22 to the iridium metal of lower conductive plate layer 20a. The higher partial pressure of oxygen during combined process 40c/42 has also been observed, according to this invention, to increase the PZT deposition rate, improving manufacturing throughput.

In each of these disclosed embodiments, the oxidation of the iridium surface of the lower conductive plate layer upon which the PZT ferroelectric material is deposited has been observed to improve the adhesion of the adjacent dissimilar materials, even in manufacturing process flows such as those intended for use with larger wafer sizes such as 300 mm wafers. It is also contemplated that those skilled in the art having reference to this specification will readily comprehend variations and alternatives to these embodiments, including alternatives and variations to the particular combinations of deposition conditions (i.e., flow rate, oxygen concentration, temperature, etc.), while remaining within the scope of the claims below.

Referring back to FIG. 2, upon completion of oxidation process 40 and PZT deposition process 42, upper conductive plate layer 20b is then deposited over PZT ferroelectric material 22 in process 44. It is contemplated that the composition of upper conductive plate layer 20b will typically be the same as that of lower conductive plate layer 20a, for symmetry and to allow the use of the same materials and processes for each. More specifically, in embodiments in which lower and upper conductive plate layers 20a, 20b are each composed of a stack of multiple conductive materials, the order of those materials in layers 20a, 20b will typically be reversed. It is contemplated that deposition process 44 will typically be performed by sputter deposition, although other techniques for depositing conductive materials may alternatively be used.

In process 46, ferroelectric capacitor 15 is then completed by the deposition of a hard mask layer (e.g., a stack of TiAlON/TiAlN), and photolithographic patterning and etching of the hard mask layer using photoresist, to define the size and location of ferroelectric capacitor 15. Following the patterning and etch of the hard mask layer, a single masked stack etch of conductive plates 20a, 20b, and ferroelectric material 22 is performed, also in process 46. Commonly assigned U.S. Pat. No. 6,656,748, incorporated herein by reference, describes an example of ferroelectric stack formation and etch process 80 suitable for use in connection with embodiments of this invention. Additional processing to complete ferroelectric capacitor 15, such as the formation of passivation films such as described in U.S. Patent Application Publication US 2013/0056811, commonly assigned herewith and incorporated herein by this reference, may also be performed. The manufacture of the integrated circuit is then completed in process 48, by conventional processes for forming the various levels of interlevel dielectrics, conductors, and the like.

As discussed above, the disclosed embodiments can enable one or more advantages in the manufacture of ferroelectric materials and integrated circuits incorporating those materials, as compared with conventional deposition processes and technologies. In particular, the disclosed embodiments improve the adhesion between the PZT ferroelectric material and the underlying conductive plate of the ferroelectric capacitor, even in modern large (300 mm) wafer manufacturing process flows. This improved adhesion is reflected by a greatly reduced susceptibility of the materials in the ferroelectric capacitor structure to delaminate, both immediately after deposition of the PZT ferroelectric material and also during the capacitor stack etch. The deleterious effects of such delamination on both the manufacturing yield and also the process throughput are thus avoided. In addition, the disclosed embodiments enable the nucleation of the PZT material as deposited to correspond to the crystalline structure of iridium metal, which results in improved electrical performance of the resulting integrated circuit, such as those including FRAM devices. It is contemplated that these and other important benefits may be enabled by the disclosed embodiments.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an integrated circuit including a ferroelectric capacitor, comprising the steps of:
    depositing a first conductive film near a semiconducting surface of a body, the first conductive film comprising a portion of iridium metal at the surface of the first conductive film;
    oxidizing the surface of the iridium metal portion;
    depositing ferroelectric material comprising lead-zirconium-titanate over the first conductive film by metalorganic chemical vapor deposition comprising the steps of:
    depositing a second conductive film overlying the ferroelectric material; and
    removing portions of the first and second conductive films, and the ferroelectric material, at selected locations, to define the ferroelectric capacitor.

2. The method of claim 1, wherein the oxidizing step forms iridium oxide of a thickness fewer than five monolayers.

3. The method of claim 1, wherein the step of forming the first conductive film comprises:
    depositing iridium metal by physical vapor deposition in a first chamber containing substantially an oxygen-free atmosphere;
    wherein the oxidizing step comprises:
    at the end of the step of depositing iridium metal, introducing oxygen into the first chamber for less than about ten seconds.

4. The method of claim 3, wherein the step of introducing oxygen introduces oxygen into the first chamber at a flow rate from about 10 sccm to about 60 sccm.

5. The method of claim 3, wherein the step of introducing oxygen is performed at a temperature of about 400 deg C and a pressure in the first chamber ranging from about 2 mTorr to about 5 mTorr.

6. The method of claim 1, wherein the step of forming the first conductive film comprises:
   depositing iridium metal by physical vapor deposition in a first chamber;
   wherein the oxidizing step comprises:
      in a second chamber, thermally oxidizing the surface of the iridium metal portion;
   and wherein the step of depositing ferroelectric material is performed in the second chamber.

7. The method of claim 6, wherein the thermally oxidizing step comprises:
   placing the second chamber at the temperature and pressure conditions to be used for the step of depositing ferroelectric material; and
   introducing oxygen into the second chamber at a flow rate ranging from about 2000 sccm to 6000 sccm to form iridium oxide at the surface of the first conductive film, under the temperature and pressure conditions to be used for the step of depositing ferroelectric material;
   and wherein the step of depositing ferroelectric material is performed in the second chamber at a susceptor temperature ranging from about 600° C. to about 650° C. and a chamber pressure ranging from 1 to 5 torr.

8. The method of claim 6, wherein the oxidizing step comprises:
   heating the second chamber to a susceptor temperature from about 600 deg C to about 650 deg C;
   then introducing oxygen into the second chamber at a flow rate ranging from about 2000 sccm to about 6000 sccm for a time ranging from about 5 seconds to about 80 seconds;
   and wherein the step of depositing ferroelectric material is performed in the second chamber at a susceptor temperature from about 600 deg C to about 650 deg C.

9. The method of claim 1, wherein the oxidizing step comprises:
   during the step of depositing ferroelectric material, introducing oxygen at a flow rate ranging from about 2000 sccm to about 6000 sccm into a chamber containing the body.

10. The method of claim 1, wherein the oxidizing step forms reactive iridium oxide.

11. The method of claim 1, wherein the step of forming the first conductive film comprises:
   depositing an oxidation barrier layer;
   then depositing a diffusion barrier layer;
   then depositing iridium metal by physical vapor deposition.

12. The method of claim 1, wherein the removing step comprises:
   after depositing the second conductive film, depositing a hard mask layer;
   photolithographically patterning and etching the hard mask layer to define the location of the capacitor; and
   then etching selected portions of the second conductive film, the ferroelectric material, and the first conductive film.

13. The method of claim 1, wherein the body is in the form of a 300 mm diameter wafer.

* * * * *